United States Patent
Zhang et al.

(10) Patent No.: US 10,298,238 B2
(45) Date of Patent: *May 21, 2019

(54) DIFFERENTIAL DRIVER WITH PULL UP AND PULL DOWN BOOSTERS

(71) Applicant: Texas Instruments Incorporated, Dallas, TX (US)

(72) Inventors: Weicheng Zhang, Chengdu (CN); Huanzhang Huang, Plano, TX (US); Yanli Fan, Allen, TX (US); Roland Sperlich, Rockwall, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 15/600,378

(22) Filed: May 19, 2017

(65) Prior Publication Data

US 2017/0257098 A1    Sep. 7, 2017

Related U.S. Application Data

(63) Continuation of application No. 14/847,264, filed on Sep. 8, 2015, now Pat. No. 9,660,652.

(60) Provisional application No. 62/054,196, filed on Sep. 23, 2014.

(51) Int. Cl.
*H03K 17/16* (2006.01)
*H03K 19/0944* (2006.01)
*H03K 19/0185* (2006.01)

(52) U.S. Cl.
CPC . *H03K 19/0944* (2013.01); *H03K 19/018578* (2013.01)

(58) Field of Classification Search
None
See application file for complete search history.

(56) References Cited

U.S. PATENT DOCUMENTS

| | | | |
|---|---|---|---|
| 8,228,096 B2* | 7/2012 | Nishi | H04L 25/0286 326/83 |
| 9,178,418 B2* | 11/2015 | K.S.V. | H04L 25/0286 |
| 9,660,652 B2* | 5/2017 | Zhang | H03K 19/018578 |
| 2010/0301905 A1* | 12/2010 | Kanda | H03K 19/01721 327/109 |
| 2011/0248745 A1 | 10/2011 | Avner et al. | |
| 2012/0262205 A1* | 10/2012 | Nishi | H04L 25/0278 327/108 |

* cited by examiner

*Primary Examiner* — Long Nguyen
(74) *Attorney, Agent, or Firm* — Andrew Viger; Charles A. Brill; Frank D. Cimino

(57) ABSTRACT

A driver includes first and second resistors coupled to a supply voltage and coupled to pairs of main transistors at positive and negative output nodes. The first and second pairs of main transistors provide emphasis and de-emphasis on the positive and negative output nodes. The driver also includes a delay inverter, a pull up booster and a pull down booster. The delay inverter delays and inverts each of a pair of differential input signals to provide delayed and inverted differential signals. The pull up booster provides a bypass current path that bypasses the first and second resistors but includes at least some of the first and second pairs of main transistors. The pull down booster provides an additional current path from the supply voltage through the first or second resistor to ground.

17 Claims, 5 Drawing Sheets

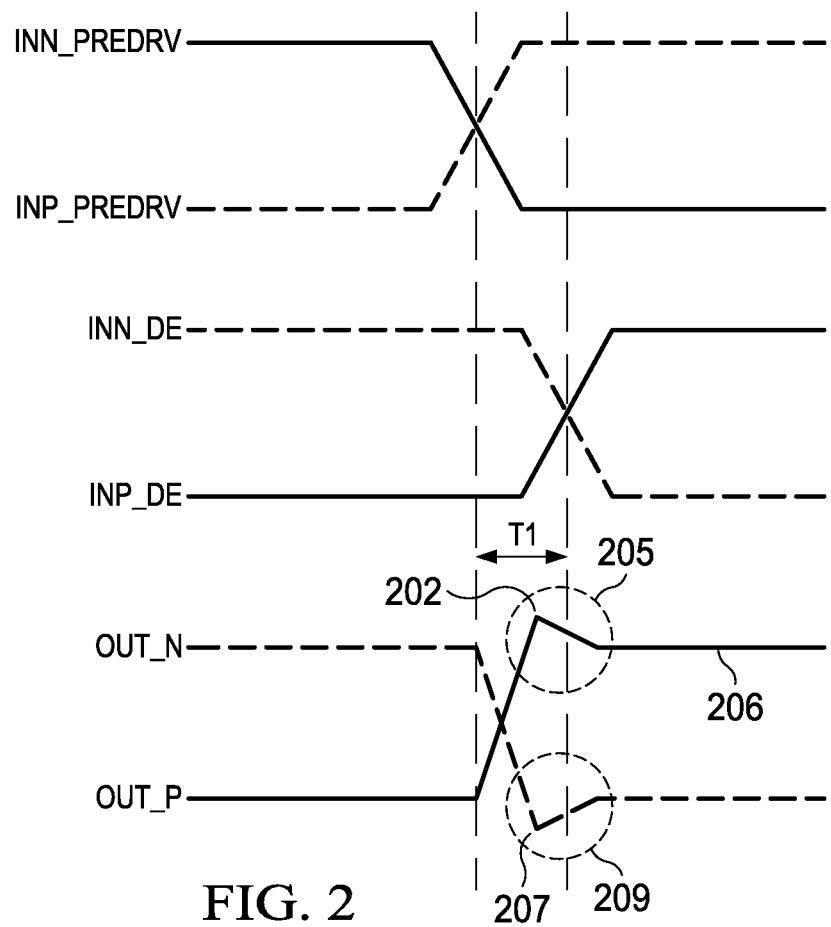
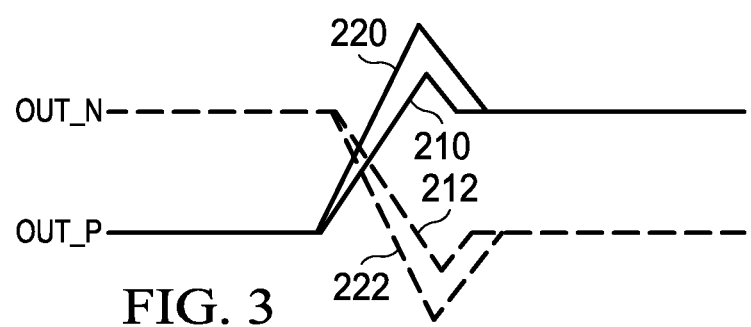

DIFFERENTIAL DRIVER WITH PULL UP AND PULL DOWN BOOSTERS

CROSS-REFERENCE TO RELATED APPLICATIONS

The present application is a continuation of U.S. patent application Ser. No. 14/847,264, filed Sep. 8, 2015, which claims priority to U.S. Provisional Patent Application No. 62/054,196, filed Sep. 23, 2014, titled "An Output Swing Boosting Circuit Of Low Voltage Differential Drivers," which are hereby incorporated herein by reference in their entirety.

BACKGROUND

Driver circuits are used to transmit electrical signals. For high frequency transmissions, drivers may include pre-emphasis and de-emphasis to compensate for high-frequency channel losses. Pre-emphasis/de-emphasis means that the output signal amplitude of the transmission bit is exaggerated to be larger than that of the non-transmission bit. That is, the absolute value of the voltage amplitude is higher during the input signal transitions than in the steady state region between input signal transitions. Voltage mode drivers are available as are current mode drivers. Both types of drivers have their advantages and disadvantages and each is best used for certain applications.

BRIEF DESCRIPTION OF THE DRAWINGS

For a detailed description of various examples, reference will now be made to the accompanying drawings in which:

FIG. 2 shows a timing diagram in accordance with various examples;

FIG. 3 shows another timing diagram showing enhanced pre-emphasis and de-emphasis due to the pull up and pull down boosters;

SUMMARY

Figure 1:
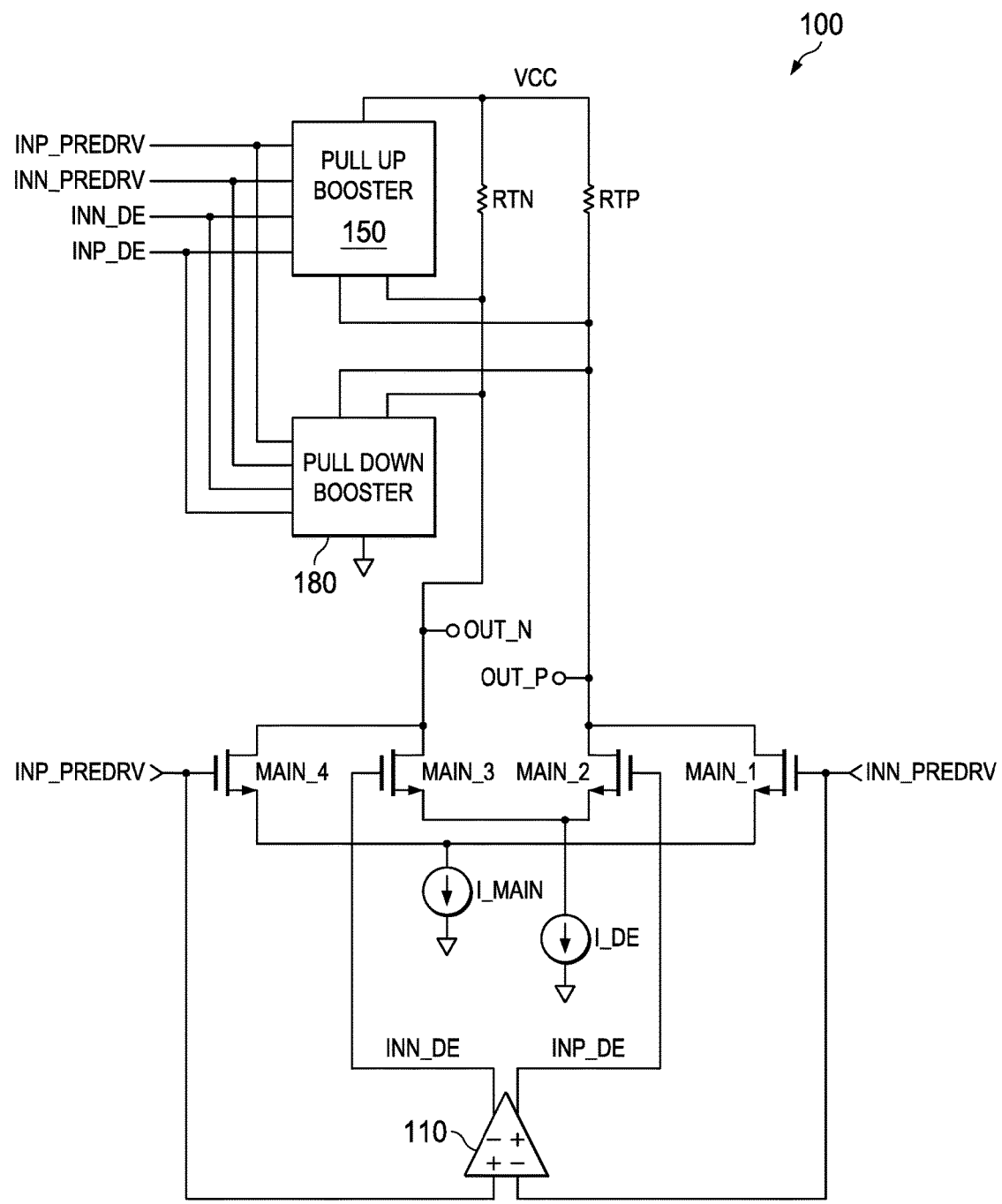
FIG. 1 shows a differential driver including a pull up booster and a pull down booster for superior emphasis and de-emphasis in accordance with various examples.

In one embodiment, a driver includes first and second resistors coupled to a supply voltage and coupled to pairs of main transistors at positive and negative output nodes. The first and second pairs of main transistors provide emphasis and de-emphasis on the positive and negative output nodes. The driver also includes a delay inverter, a pull up booster and a pull down booster. The delay inverter delays and inverts each of a pair of differential input signals to provide delayed and inverted differential signals. The pull up booster provides a bypass current path that bypasses the first and second resistors but includes at least some of the first and second pairs of main transistors. The pull down booster provides an additional current path from the supply voltage through the first or second resistor to ground.

In another embodiment, a differential driver includes a first resistor coupled to a supply voltage and to a first pair of main transistors at a positive output node. A second resistor is to be coupled to the supply voltage and to a second pair of main transistors at a negative output node. The first and second pairs of main transistors are configured to provide emphasis and de-emphasis on the positive and negative output nodes. A pull up booster couples to the first and second resistors and is configured to provide, only during transitions of differential input signals, a bypass current path that bypasses the first and second resistors but includes at least some of the first and second pairs of main transistors.

In yet another embodiment, a differential driver comprises a first resistor to be coupled to a supply voltage and to a first pair of main transistors at a positive output node. A second resistor is to be coupled to the supply voltage and to a second pair of main transistors at a negative output node. The first and second pairs of main transistors are configured to provide emphasis and de-emphasis on the positive and negative output nodes. A delay inverter is configured to delay and invert each of a pair of differential input signals to provide delayed and inverted differential signals. A pull down booster is coupled to the positive and negative output nodes and is configured to provide, only during the transitions of the differential input signals, an additional current path from the supply voltage through the first or second resistor to ground, the additional current path is in addition to a current path from the supply voltage through the first or second resistor and at least some of the first and second pairs of main transistors.

DETAILED DESCRIPTION

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections.

Some transmission applications must operate from relatively low power supply voltages (e.g., at or below 1.2V). Such low power supply voltages make it difficult for a voltage mode driver to operate effectively. Instead, current mode drivers may be preferred for low voltage applications. Large output voltage swings are beneficial to improve the signal quality at the receiver end. Therefore, for current mode drivers, it may be desired to have a large tail current to improve the output voltage swing. For current mode drivers, it is important to guarantee a constant tail current for all points in time. The accuracy of the tail current is impacted by such factors as the output impedance of the tail current itself, the saturation margin of the tail current, and the behavior of the tail current during the signal transition moment due to the charging and discharging of the parasitic capacitance at the drain node of the tail current source. Because of these limitations, the output voltage swing is usually less than the theoretical value of the tail current times the output load resistance, especially during the signal transition period. Boosting the output swing in low power, high speed drivers is problematic.

The disclosed embodiments address this problem by employing pull up and pull down booster circuits (termed "pull up booster" and "pull down booster" herein) in a differential current mode driver. The differential driver is configured to receive a differential pair of input signals. Output voltages are developed by a target amount of current flowing through a pair of resistors and through a set of main transistors. Each resistor connects to the power supply voltage. The opposing terminal of each resistor represents an output voltage node. The pull up booster is active only during the transition periods of the different input signals. When active, the pull up booster provides a bypass current path that bypasses the resistors but includes at least some of the main transistors. Because the current bypasses the resistors, there is less voltage drop developed across the resistors and as such the output voltage is higher during the transitions than would be the case without the pull up booster.

The pull down booster also is active only during the transition periods of the differential input signals. The pull down booster is configured to reciprocally provide an additional current path from a supply voltage through the resistors to ground. The additional current path is in addition to a current path from the supply voltage through each resistor and at least some of the main transistors. Because additional current is caused to flow through the resistors, an increased voltage drop is caused to occur across the resistor through which the additional current flows. As a result, the output voltage associated with that resistor is even lower than would have been during the transition period absent the pull down booster.

In some embodiments, both the pull up booster 150 and bull down booster 180 are present. In other embodiments, the pull up booster 150 may be present but not the pull down booster 180. In yet other embodiments, the pull down booster 180 is present but not the pull up booster 150.

FIG. 1 shows an example of a differential current mode driver 100. As shown, the driver 100 includes a plurality of main transistors—MAIN_1, MAIN_2, MAIN_3, and MAIN_4, which may be implemented as N-channel metal oxide semiconductor field effect transistors (MOSFETs). The term "main" does not designate any particular functionality or importance and is intended merely to better differentiate those transistors from the transistors discussed below with respect to the pull up and pull down boosters. The driver 100 also includes resistors RTN and RTP and an invert/delay circuit 110. Resistor RTN couples between a power supply voltage (VCC) and the drain terminals of the MAIN_3 and MAIN_4 transistors. Similarly, resistor RTP couples between VCC and the drain terminals of the MAIN_1 and MAIN_2 transistors. The source terminals of MAIN_2 and MAIN_3 are connected together and to a common de-emphasis current source, I_DE. The source terminals of MAIN_1 and MAIN_4 also are connected together and to a common main current source, I_MAIN. The I_DE and I_MAIN current sources cause a fixed amount of current to flow through the RTN and RTP resistors when various of the main transistors are turned on. Preferably, the I_MAIN current source generates a larger amount of current than the I_DE current source.

Which of the main transistors, MAIN_1, MAIN_2, MAIN_3, and MAIN_4, are on at any point in time depends, in large part, on the logic levels of the differential input signals, which are shown in FIG. 1 as INP_PREDRV and INN_PREDRV. The INP_PREDRV input signal controls the gate of MAIN_4 and the INN_PREDRV input signal controls the gate of MAIN_1. The input signals INP_PREDRV and INN_PREDRV also are provided to the invert/delay circuit 110. The invert/delay circuit 110 inverts the logic state of each input signal. As such, the signal designated INN_DE is the inverted version of INP_PREDRV and the signal designated INP_DE is the inverted version of INN_PREDRV. The INN_DE and INP_DE signals are provided to and control the gates of the MAIN_3 and MAIN_2 transistors, respectively. The invert/delay circuit 110 also introduces a time delay into the inverted signals. Thus, as the INP_PREDRV input signal transitions from low to high, its inverted counterpart signal INN_DE transitions from high to low but with a defined time delay. As such, during each input signal transition period, each input signal and its inverted counterpart are at the same logic level for brief periods of time. Thus, IPN_PREDRV and INN_DE are briefly at the same level, as are INN_PREDRV and INP_DE.

Each input signal and its inverted counterpart briefly being at the same logic level during each edge transition causes a certain amount of pre-emphasis and a de-emphasis to occur on the output signal nodes designated as OUT_N and OUTP. OUT_N is at the connection point between the resistor RTN and the drain of the MAIN_3 transistor, while OUT_P is at the connection point between the resistor RTP and the drain of MAIN_2 transistor.

Ignoring the operation of the pull up booster 150 and the pull down booster 180, during a steady phase (no transition edges) at which INP_PREDRV is a logic high (and INN_PREDRV is a logic low, MAIN_4 will be on and MAIN_1 will be off. Because INN_DE and INP_DE represent the opposite logic levels of INP_PREDRV and INN_PREDRV, respectively, MAIN_3 will be off and MAIN_2 will be on. As such, a current path is established from VCC, through RTN, and through MAIN_4. The magnitude of the current in that path is largely controlled by the I_MAIN current source. Because MAIN_2 also is on, another current path is established from VCC, through resistor RTP, and through MAIN_2. The magnitude of the current in that path is largely controlled by the I_DE current source. Because I-MAIN sources more current than I_DE, the magnitude of the current through RTN is larger than that through RTP. The current that flows through the resistors RTN and RTP causes a voltage drop to be developed across each respective resistor. Since one terminal of each resistor is connected to VCC, the opposing terminal (most of which also is an output voltage node) will be a voltage lower than VCC and will be a voltage that is VCC minus the product of the current and the resistance of the resistor. Because I_MAIN (which flows through RTN when INP_PREDRV is high) is larger than I_DE (most of which flows through RTP when INN_PREDRV is low), the OUT_N output voltage will be lower (i.e., a logic low) than the OUT_P output voltage (a logic high).

A similar analysis can be made when INP_PREDRV is low and INN_PREDRV is high. In that state, only the MAIN_3 and MAIN_1 transistors are on (MAIN_2 and MAIN_4 are off). More current flows through RTP (current controlled by I_MAIN) than RTN (current controlled by I_DE) and, as a result, OUT_N will be a logic high and OUT_P will be a logic low.

The following discussion pertains to the operation of the main transistors during a transition of the differential input signals. Reference will be made to the driver of FIG. 1 and the timing diagram of FIG. 2. In FIG. 2, the INN_PREDRV and INP_PREDRV input signals are shown transitioning from high to low and low to high, respectively. Signals INN_DE and INP_DE are also shown making the transitions albeit with a time delay caused by invert/delay circuit 110. Prior to the signal transitions, OUT_N is high and OUT_P is low. During the transitions and as seen in FIG. 2, there is a period of time T1 during the signal transition in which both INN_PREDRV and its inverted delayed counterpart, INP_DE, are both low. During this time period, INN_PRE-DRV has transitioned to the low state and INP_DE has not yet become high due to the delaying effect caused by the invert/delay circuit 110. With those signals both low, MAIN_1 and MAIN_2 conduct very little current and thus OUT_P has a voltage level identified at 202 in FIG. 2 that is higher than the steady state voltage identified at 206. During the steady state of INN_PREDRV being low, as explained above MAIN_2 will be on and MAIN_1 will be off and thus more current will flow through resistor RTP than with MAIN_1 and MAIN_2 both being generally off. The increased voltage level identified at 205 represents pre-emphasis on the output voltage for a rising edge of the output voltage signal to counteract the high frequency losses customary in transmission channel.

A similar effect occurs for a falling edge of an output voltage signal. With INP_PREDRV high and INP_DE low in the steady state before the signal transition, OUT_P is low because current due to the I_MAIN current source is caused to flow through resistor RTN which results in a relatively large voltage drop across resistor RTN. During the transition period T1, both INP_PREDRV and INP_DE are high (INPT_PREDRV has transitioned from low to high and INP_DE was already high and has not become low due to the delaying effect of the invert/delay circuit 110). Consequently, both MAIN_3 and MAIN_4 are on which causes a large amount of current to be sourced through RTN—due to both the I_MAIN and I_DE current sources. This temporarily large amount of current results in large voltage drop indicated at 207 on the OUT_N voltage node. The OUT_N voltage level increases slightly once INP_DE transitions to a logic low level thereby turning MAIN_3 off which reduces the amount of current through RTN.

As such, at each signal transition, a short-lived increase in voltage (in an absolute value sense) occurs for pre-emphasis and de-emphasis. However, such pre-emphasis and de-emphasis levels may not be large enough particularly at lower levels of VCC. The driver 100 in the example of FIG. 1 includes a pull up booster 150 and a pull down booster 180 to provide additional pre-emphasis and de-emphasis.

Referring again to FIG. 1, the pull up booster 150 is a circuit that is generally connected in parallel across resistors RTN and RTP. As such, the pull up booster 150 connects to the supply voltage node (VCC) as does the resistors RTN and RTP, and to the opposing terminals of resistors RTN and RTP. During the steady state phase of the differential input signals INN_PREDRV and INP_PREDRV, the pull up booster 150 is inactive and generally does nothing. The pull up booster 150 preferably is only active during the transition periods T1 of the differential input signals. When active, the pull up booster introduces a bypass current path that bypasses whichever of resistors RTN or RTP whose output node is high. For example, referring to FIG. 2, when INP_PREDRV and INP_DE both are temporarily low (which resulted in the emphasis voltage at 202 on OUT_P), the pull up booster bypasses some of the current that would have flowed through RTN. The bypass current path includes some of the main transistors that continue to operate as described above. As a result of the current bypass paths created by the pull up booster 150, even less current flows through RTN which results in the OUT_N output voltage level being higher than it would have been without the pull up booster. The enhanced pre-emphasis caused by the pull up booster 150 is illustrated in the timing diagram of FIG. 3. The OUT_P signal level is shown rising from a low to a high signal level. The lower pre-emphasis waveform 210 is the waveform as described above that would have resulted had the pull up booster 150 been absent. The higher pre-emphasis waveform 220 is the waveform that is created due to the addition of the pull up booster 150.

When a bypass current path is created for the resistor branch for which the output voltage node is high, no similar current path is created by the pull up booster 150 for the other resistor branch. That is, the pull up booster 150 creates only one bypass current path for each signal transition and alternates the created current path between the two resistor branches.

The pull down booster 180 couples to the output voltage nodes OUT_P and OUT_N and is configured to provide, only during the transitions of the differential input signals, an additional current path to ground from the supply voltage VCC through one of the resistors RTN and RTP for which I_MAIN plus I_DE current is flowing due to one pair of main transistors being turn one (i.e., pair MAIN_1 and MAIN_2, or pair MAIN_3 and MAIN_4). The additional current path is in addition to the current path from VCC through the resistor RTN or RTP and the corresponding pair of "on" main transistors. Because additional current is caused to flow through the resistor RTN or RTP the voltage drop across that resistor is even larger than it would otherwise been and thus the output voltage node on that resistor node is even lower than it would have been without the action of the pull down booster 180.

The enhanced de-emphasis caused by the pull down booster 180 is illustrated in the timing diagram of FIG. 3. The OUT_N signal level is shown falling from a high to a low. The lower de-emphasis waveform 212 is the waveform as described above that would occur if the pull down booster 180 had been absent. The higher magnitude pre-emphasis waveform 222 is the waveform that is created due to the addition of the pull down booster 180.

Figure 4:
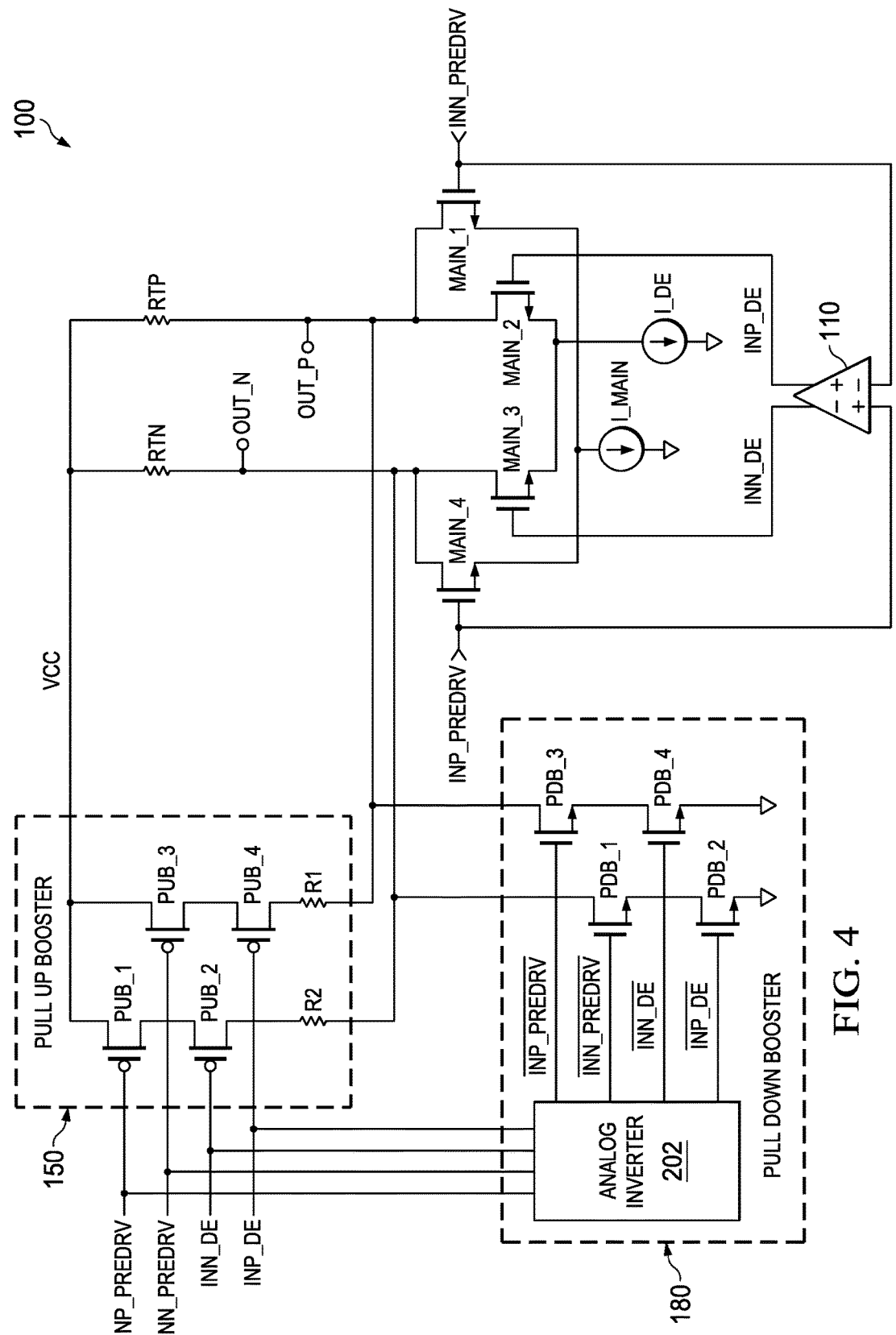
FIG. 4 shows the differential driver of FIG. 1 with additional detail for the pull and pull down boosters in accordance with various examples.

FIG. 4 shows the differential current mode driver 100, but examples of the implementations of the pull up booster 150 and pull down booster 180. The rest of the driver 100 includes the main transistors MAIN_1 through MAIN_4, the current sources I_MAIN and I_DE, and the invert/delay circuit 110. The explanation of those circuit components is not repeated here.

One embodiment of the pull up booster 150 may be as shown in FIG. 4. The pull up booster 150 in this embodiment includes a plurality (two in this example) of series-connected transistors. One set of series-connected transistors includes PUB_1 and PUB_2, and another set of series-connected transistors includes PUB_3 and PUB_4. The drain of PUB_1 is connected to VCC and the source of PUB_1 and drain of PUB_2 are connected together. Similarly, the drain of PUB_3 is connected to VCC and the source of PUB_3 and drain of PUB_4 are connected together. The source of PUB_2 connects to resistor R2, and the source of PUB_4 connects to resistor R1. The pull up booster's transistors PUB_1 through PUB_4 may be implemented as P-channel MOSFETs in some embodiments.

The gates of the pull up booster's transistors PUB_1 through PUB_4 are controlled by the two differential input signals INP_PREDRV and INN_PREDRV as well as their inverted and delay counterpart signals INN_DE and INP_DE. Specifically, the gate of PUB_1 is controlled by INP_PREDRV. The gate of PUB_2 is controlled by INN_DE. The gate of PUB_3 is controlled by INN_PREDRV. The gate of PUB_4 is controlled by INP_DE.

The example of the pull down booster 180 in FIG. 4 includes an analog inverter 202 as well as a plurality (two in this example) of pairs of series-connected transistors. One pair includes PDB_1 and PDB2, and the other pair includes PDB_3 and PDB4. The pull down booster's transistors PDB_1 through PDB_4 may be implemented as N-channel MOSFETs in some embodiments. Series-connected transistor pair PDB_1 and PDB_2 connects between resistor R2 and ground as shown. Similarly, series-connected transistor pair PDB_3 and PDB_4 connects between resistor R1 and ground. The two differential input signals INP_PREDRV and INN_PREDRV and their inverted and delay counterpart signals INN_DE and INP_DE are provided to and inverted by the analog inverter 202 to produce inverted counterparts of the four control signals—namely, $\overline{INP\_PREDRV}$, $\overline{INN\_PREDRV}$, $\overline{INP\_DE}$, and $\overline{INN\_DE}$. These inverted control signals control the gates of the pull down booster's transistors. Specifically, $\overline{INP\_PREDRV}$ controls the gate of PDB_1. Control signal $\overline{INN\_DE}$ controls the gate of PDB_2. Control signal $\overline{INP\_PREDRV}$ controls the gate of PDB_3, and $\overline{INP\_DE}$ controls the gate of PDB_4.

The operation of the embodiments of the pull up and pull down boosters 150, 180 of FIG. 4 will now be described. During the steady state (i.e., not at a signal transition) one of series-connected transistor pair PUB_1 and PUB_2 is off. The same is true with respect to the other pair—PUB_3 and PUB_4. Because one of each pair is off during the state phases, no bypass current path is formed by the pull up booster 150. The pull up booster 150 thus is inactive during the steady state phase. The same is true for the pull down booster 180. During the steady state phase, either PDB_1 or PDB_2 is off and either PDB_3 or PDB_4 is off. As such, no additional current path to ground is created by the pull down booster 180 during the steady state phase, and the pull down booster is thus inactive.

Figure 5:
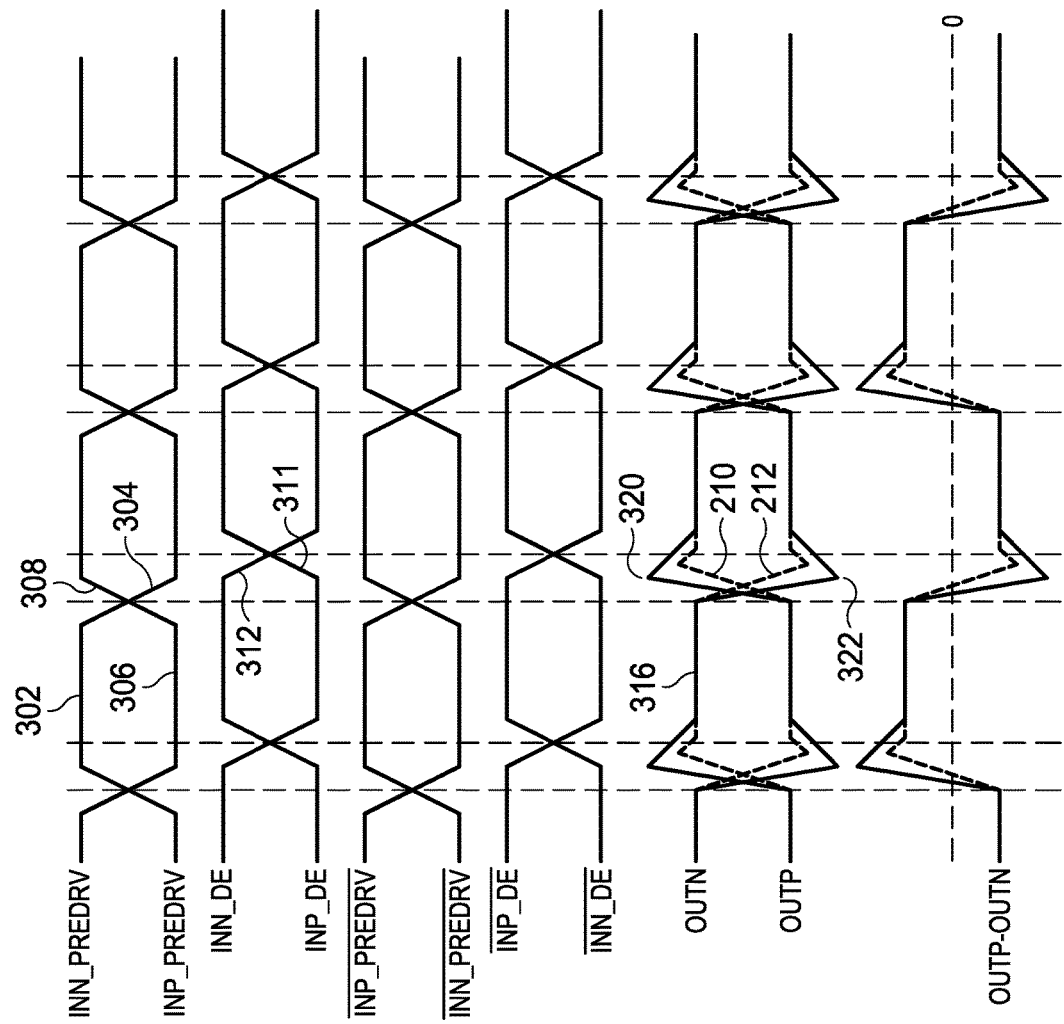
FIG. 5 shows a timing diagram in accordance with various examples.

To generate extra pre-emphasis, the pull up booster 150 forms a bypass current path through one of its pair of series-connected transistors at each signal transition. Referring to FIGS. 4 and 5 (timing diagram), consider the steady state (identified as 302 in FIG. 5) in which INP_PREDRV is high and its delayed and inverted counterpart INN_DE is low. In that state, MAIN_4 is on, MAIN_3 is off, and current flows through RTN due to the I_MAIN current source. When INP_PREDRV transitions to the low state at 304, INN_DE remains low (for the duration of the time delay) as indicated at 311. Thus both INP_PREDRV and INN_DE are momentarily low. Main transistors MAIN_3 and MAIN_4 conduct some current due to a common mode voltage that may be on the differential input signals. With both INP_PREDRV and IN_DE being low, because those signals control the gates of the P-channel MOSFETS PUB_1 and PUB_2, PUB_1 and PUB_2 are in the on state thereby forming the bypass current path to bypass current around resistor RTN. Of course, some current still flows through RTN but because PUB_1 and PUB_2 form a lower resistance path, but more current flows through those transistors than through RTN. The complete current path is from VCC, through PUB_1, through PUB_2, through resistor R2 and through transistors MAIN_3 and MAIN_4 which remain partially conductive due the common mode voltage on the input signals. As less current flows through RTN, the voltage on OUT_N is higher than without the pull up booster 150. This increased pre-emphasis effect is shown at 320 in FIG. 5.

Figure 6:
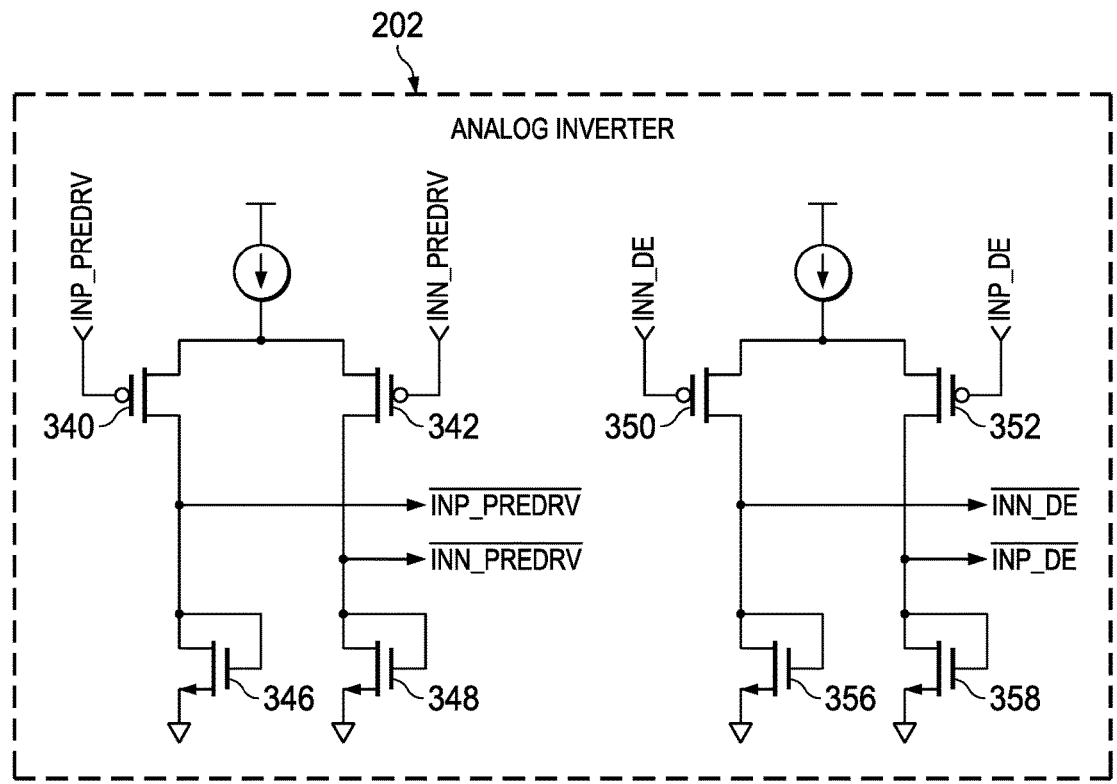
FIG. 6 shows an implementation of an analog inverter for use in the pull down booster.

Analyzing the other resistor branch containing resistor RTP, during the steady state in which INN_PREDRV is low (identified at 306) and its inverted and delayed counterpart INP_DE is high, MAIN_2 is on, MAIN_1 is off, and current flows through RTP due to the I_DE current source. Because I_DE is a relatively small current, OUT_P is at a logic high state as indicated at 316. When INN_PREDRV transitions to the high state at 308, INP_DE remains high (for the duration of the time delay) as indicated at 312. Thus both INN_PREDRV and INP_DE are momentarily high. Main transistors MAIN_1 and MAIN_2 conduct current due to the current sources I_MAIN and I_DE. With both INN_PREDRV and INP_DE being high, both INP_PREDRV and INN_DE are low, and thus $\overline{INP\_PREDRV}$ and $\overline{INP\_DE}$ are both high thereby turning on the series-connected transistor pair PDB_3 and PDB_4. With PDB_3 and PDB_4 being on, a current path from the output node OUT_P to ground is created through the PDB_3 and PDB_4 transistor pair. This additional current path causes additional current to flow through resistor RTP (in addition to the current generated by the I_MAIN and I_DE current sources). This additional current causes an even larger de-emphasis dip on the OUT_P voltage as indicated at 322 in FIG. 5. The pre-emphasis and de-emphasis waveforms without the use of the pull up booster 150 and pull down booster 180 is shown FIG. 6 shows an embodiment of the analog inverter 202 to generate the inverted versions of the four control signals INP_PREDRV, INN_PREDRV, INN_DE and INP_DE. Each inverter shown in this example is a current mode inverter. The differential input signals INP_PREDRV and INN_PREDRV are provided to the gates of P-channel MOSFETS 340 and 342 whose drains are connected to a current source. A current mirror implemented by transistors 346 and 348 is also provided. A second inverter comprising transistors 350, 352, 356 and 358 is also included to invert the control signals INN_DE and INP_DE as shown.

Figure 7:
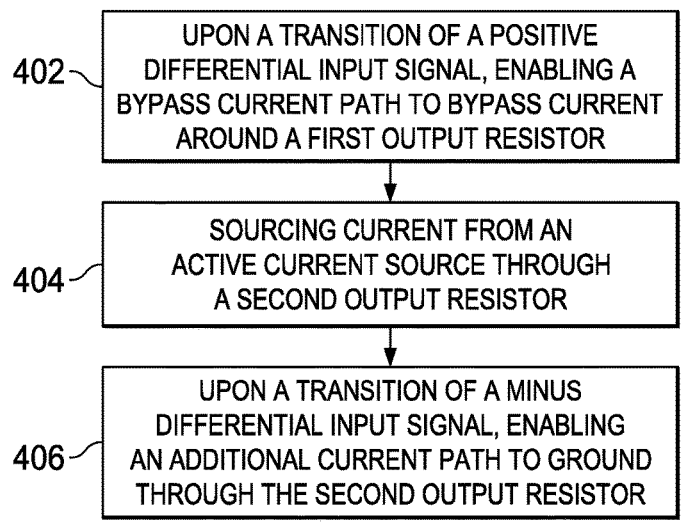
FIG. 7 shows a method flow chart in accordance with various examples.

FIG. 7 shows a method in accordance with an embodiment. At 402, upon detection of a transition of a positive differential input signal (e.g., INP_PREDRV), enabling a bypass current path to bypass current path around a first output resistor. For example, the pull up booster 150 may enable a bypass current path to ground to thereby cause less current to flow through resistor RTN. The bypass current path preferably is only formed during transition of a differential input signal as explained above.

At 404, the method further includes sourcing current from an active current source (e.g., I_DE) through a second output resistor. For example, current determined in large part by I_DE may be caused to flow from VCC through RTP and MAIN_2. At 404, upon detection of a transition of a minus differential input signal, the method includes enabling an additional current path to ground through the second output resistor. For example, the pull down booster 180 is caused to create a current path from VCC, through resistor RTP, and through the pull down booster 180 to ground which is in addition to the current path from VCC, through the resistor RTP, and through MAIN_2 and I_DE. The creation of the additional current path and the bypass current path reciprocally occur on the transition edges of the differential input signals as explained above.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A differential driver, comprising:
   a first resistor coupled to a supply voltage node and to a first pair of main transistors at a positive output node of the differential driver;
   a second resistor coupled to the supply voltage node and to a second pair of main transistors at a negative output node of the differential driver;
   a pull up booster having at least one differential input terminal and a differential output terminal, the at least one differential input terminal coupled to a gate terminal of a first transistor of the first pair of main transistors and to a gate terminal of a first transistor of the second pair of main transistors, the differential output terminal coupled to the positive output node and the negative output node of the differential driver, the pull up booster providing a bypass current path that bypasses the first and second resistors but includes at least some of the first and second pairs of main transistors; and
   a pull down booster having at least one differential input terminal and a differential output terminal, the at least one differential input terminal of the pull down booster coupled to the gate terminal of the first transistor of the first pair of main transistors via an analog inverter and coupled to the gate terminal of the first transistor of the second pair of main transistors via the analog inverter, the differential output terminal of the pull down booster coupled to the positive and negative output nodes of the differential driver, the pull down booster providing an additional current path from the supply voltage through the first or second resistor to ground, the additional current path is in addition to a current path from the supply voltage through the first or second resistor and at least some of the first and second pairs of main transistors.

2. The differential driver of claim 1, wherein the pull up booster includes a plurality of pairs of series connected-transistors, and wherein during a transition of differential input signals, one pair of the series-connected transistors is turned on to thereby provide the bypass current path.

3. The differential driver of claim 1, wherein the pull down booster includes a plurality of pairs of series-connected transistors, and wherein during a transition of differential input signals, one pair of the series-connected transistors is turned on to thereby provide the additional current path to ground.

4. The differential driver of claim 3, wherein the pull down booster further includes the analog inverter having a differential input terminal and a differential output terminal, the differential input terminal of the analog inverter coupled to the gate terminal of the first transistor of the first pair of main transistors and to the gate terminal of the first transistor of the second pair of main transistors, the differential output terminal of the analog inverter coupled to the at least one differential input terminal of the pull down booster.

5. The differential driver of claim 1, wherein the first and second pairs of main transistors provide emphasis and de-emphasis on the positive and negative output nodes.

6. The differential driver of claim 1 further comprising:
   a delay inverter having a differential input terminal and a differential output terminal, the differential input terminal of the delay inverter coupled to the gate terminal of the first transistor of the first pair of main transistors and to the gate terminal of the first transistor of the second pair of main transistors, the differential output terminal of the delay inverter coupled to a gate terminal of a second transistor of the first pair of main transistors and to a gate terminal of a second transistor of the second pair of main transistors.

7. A differential driver, comprising:
   a first resistor coupled to a supply voltage node and to a first pair of main transistors at a positive output node of the differential driver;
   a second resistor coupled to the supply voltage node and to a second pair of main transistors at a negative output node of the differential driver; and
   a pull up booster having at least one differential input terminal and a differential output terminal, the at least one differential input terminal of the pull up booster coupled to a gate terminal of a first transistor of the first pair of main transistors and to a gate terminal of a first transistor of the second pair of main transistors, the differential output terminal of the pullup booster coupled to the positive output node and the negative output node of the differential driver, the pull up booster providing a bypass current path that bypasses the first and second resistors but includes at least some of the first and second pairs of main transistors.

8. The differential driver of claim 7, wherein the pull up booster includes a plurality of pairs of series connected-transistors, and wherein during a transition of differential input signals, one pair of the series-connected transistors is turned on to thereby provide the bypass current path.

9. The differential driver of claim 7 further comprising:
   a pull down booster having at least one differential input terminal and a differential output terminal, the at least one differential input terminal of the pull down booster coupled to the gate terminal of the first transistor of the first pair of main transistors via an analog inverter and coupled to the gate terminal of the first transistor of the second pair of main transistors via the analog inverter, the differential output terminal of the pull down booster coupled to the positive and negative output nodes of the differential driver, the pull down booster providing an additional current path from the supply voltage through the first or second resistor to ground, the additional current path is in addition to a current path from the supply voltage through the first or second resistor and at least some of the first and second pairs of main transistors.

10. The differential driver of claim 9 further comprising:
    a delay inverter having a differential input terminal and a differential output terminal, the differential input terminal of the delay inverter coupled to the gate terminal of the first transistor of the first pair of main transistors and to the gate terminal of the first transistor of the second pair of main transistors, the differential output terminal of the delay inverter coupled to a gate terminal of a second transistor of the first pair of main transistors and to a gate terminal of a second transistor of the second pair of main transistors.

11. The differential driver of claim 10, wherein the pull down booster further includes the analog inverter having a differential input terminal and a differential output terminal, the differential input terminal of the analog inverter coupled to the gate terminal of the first transistor of the first pair of main transistors and to the gate terminal of the first transistor of the second pair of main transistors, the differential output terminal of the analog inverter coupled to the at least one differential input terminal of the pull down booster.

12. The differential driver of claim 7, wherein the first and second pairs of main transistors provide emphasis and de-emphasis on the positive and negative output nodes.

13. A differential driver, comprising:
a first resistor coupled to a supply voltage node and to a first pair of main transistors at a positive output node of the differential driver;
a second resistor coupled to the supply voltage node and to a second pair of main transistors at a negative output node of the differential driver; and
a pull down booster having at least one differential input terminal and a differential output terminal, the at least one differential input terminal of the pull down booster coupled to a gate terminal of a first transistor of the first pair of main transistors via an analog inverter and coupled to a gate terminal of a first transistor of the second pair of main transistors via the analog inverter, the differential output terminal of the pull down booster coupled to the positive and negative output nodes of the differential driver, the pull down booster providing an additional current path from the supply voltage through the first or second resistor to ground, the additional current path is in addition to a current path from the supply voltage through the first or second resistor and at least some of the first and second pairs of main transistors.

14. The differential driver of claim 13 further comprising:
a pull up booster having at least one differential input terminal and a differential output terminal, the at least one differential input terminal of the pull up booster coupled to the gate terminal of the first transistor of the first pair of main transistors and to the gate terminal of the first transistor of the second pair of main transistors, the differential output terminal of the pull up booster coupled to the positive output node and the negative output node of the differential driver, the pull up booster providing a bypass current path that bypasses the first and second resistors but includes at least some of the first and second pairs of main transistors.

15. The differential driver of claim 13 further comprising:
a delay inverter having a differential input terminal and a differential output terminal, the differential input terminal of the delay inverter coupled to the gate terminal of the first transistor of the first pair of main transistors and to the gate terminal of the first transistor of the second pair of main transistors, the differential output terminal of the delay inverter coupled to a gate terminal of a second transistor of the first pair of main transistors and to a gate terminal of a second transistor of the second pair of main transistors.

16. The differential driver of claim 14, wherein the pull down booster further includes an analog inverter having a differential input terminal and a differential output terminal, the differential input terminal of the analog inverter coupled to the gate terminal of the first transistor of the first pair of main transistors and to the gate terminal of the first transistor of the second pair of main transistors, the differential output terminal of the analog inverter coupled to the at least one differential input terminal of the pull down booster.

17. The differential driver of claim 13, wherein the first and second pairs of main transistors provide emphasis and de-emphasis on the positive and negative output nodes.

* * * * *